United States Patent [19]

Shoji et al.

[11] Patent Number: 4,736,012

[45] Date of Patent: Apr. 5, 1988

[54] SEMICONDUCTOR DEVICE

[75] Inventors: Fusaji Shoji, Yokohama; Akihiro Kenmotsu, Fujisawa; Isao Obara, Kamakura; Hitoshi Yokono, Toride; Takeshi Komaru, Tachikawa, all of Japan

[73] Assignee: Hitachi, Ltd., Tokyo, Japan

[21] Appl. No.: 625,968

[22] Filed: Jun. 29, 1984

[30] Foreign Application Priority Data

Jul. 1, 1983 [JP] Japan .................. 58-118140

[51] Int. Cl.$^4$ .............................. C08G 69/26
[52] U.S. Cl. .................. 528/188; 528/353; 357/72
[58] Field of Search .............. 528/188, 353; 357/72

[56] References Cited

U.S. PATENT DOCUMENTS

| | | | |
|---|---|---|---|
| 3,632,433 | 1/1972 | Tokuyama et al. | 29/578 X |
| 3,953,877 | 4/1976 | Sigusch et al. | 357/72 |
| 4,017,886 | 4/1977 | Tomono et al. | 357/54 |
| 4,040,083 | 8/1977 | Saiki et al. | 357/54 |
| 4,091,407 | 5/1978 | Williams et al. | 357/54 |
| 4,323,405 | 4/1982 | Uno et al. | 156/64 |
| 4,378,400 | 3/1983 | Makino et al. | 528/188 |
| 4,473,523 | 9/1984 | Sasaki et al. | 528/188 |
| 4,494,217 | 1/1985 | Sizuki et al. | 365/53 |

FOREIGN PATENT DOCUMENTS

| | | |
|---|---|---|
| 0019391 | 11/1980 | European Pat. Off. . |
| 2039145 | 7/1980 | United Kingdom ........ 528/188 |
| 2067013 | 7/1981 | United Kingdom . |
| 2098800 | 11/1982 | United Kingdom . |
| 2097999 | 11/1982 | United Kingdom . |

OTHER PUBLICATIONS

Anolich, E. S., "Prevention . . . Alpha Emission" in *IBM Tech. Discl. Bull.*, vol. 22, No. 2, Jul. 1979, p. 678.

Dougherty, W. D., "Low α Particle Package Design" in *IBM Tech. Discl. Bull.*, vol. 22, No. 7, Dec. 1979, p. 2748.

*Electronics*, Jun. 8, 1978, pp. 42-43.

Mukai, K. et al, "Planar Multilevel . . . Polyimide" in *IEEE J. Sol.-State Circ.*, vol. SC-13, No. 4, Aug. 1978, pp. 462-467.

Anolick, E. S., "Reduction of Memory Errors Due to Alpha Particles" in *IBM Tech. Discl. Bull.*, vol. 22, No. 6, Nov. 1979, pp. 2345-2346.

Ward, W. E., "Alpha Particle Shield" in *IBM Tech. Discl. Bull.*, vol. 22, No. 4, Sep. 1979, p. 1398.

*Primary Examiner*—John Kight
*Assistant Examiner*—M. L. Moore
*Attorney, Agent, or Firm*—Antonelli, Terry & Wands

[57] ABSTRACT

A semiconductor device containing an α-rays shielding resin layer on at least active portion of a semiconductor element, said α-rays shielding resin being a special polyimide resin, is excellent in thermal resistance at the time of sealing the semiconductor element, adhesion of the α-rays shielding layer to the semiconductor element, and α-rays shielding ability.

12 Claims, 2 Drawing Sheets

SEMICONDUCTOR DEVICE

BACKGROUND OF THE INVENTION

This invention relates to a semiconductor device, particularly a ceramic packaged or resin molded semiconductor device comprising a semiconductor element in which a α-rays shielding resin layer is formed at least on the active portion of the surface.

Semiconductor devices are usually sealed by a ceramic package or sealed by a resin (namely, resin molded). However, a ceramic material constituting the ceramic package, and the resin and an inorganic filler constituting the resin mold contain radioactive elements such as uranium, thorium or the like in a concentration of the order of several ppm. These radioactive elements emit α-rays. Therefore, the active portion of a semiconductor element is irradiated with α-rays, which cause soft errors (May T. C. and Woods M. H. "A New Physical Mechanism for Soft Error in Dynamic Memories" 1978 Int. Reliability Physics Symposium IEEE Catalogue N78CH1294-8PHY, PP 33–40).

In order to prevent soft errors of a semiconductor device due to such irradiation with α-rays, it has been disclosed in British Patent Publication No. 2,036,428A that the active portion of a semiconductor element is coated, for example, with a polyimide resin layer comprising poly(4,4'-phenylenoxy phenylene pyromellitic imide) or polyimideisoindoloquinazolinedione.

However, in some cases, these polyimide resin layers decomposed on heat treatment in sealing a ceramic package with glass, and the sealing glass portion was put outward by the pressure of the cracked gas produced, so that the seal width was decreased, resulting in insufficiency of air-tightness.

When the heat resistance of such polyimide resins was tried to be improved in order to prevent the cracked gas from being produced, since in the case of conventional poly(phenylene pyromellitic imide) or the like, the resin layer was hard, was poor in adhesion to a semiconductor element and had no flexibility, the resin layer cracked or peeled off in some cases.

Further, unless the thickness of the polyimide resin layer is larger than about 45 μm, sufficient shielding against α-rays has been impossible. However, it is not easy to form a resin layer having such a thickness by a present-day coating technique other than dropping.

SUMMARY OF THE INVENTION

An object of this invention is to provide a ceramic packaged or resin molded semiconductor device comprising a semiconductor element on which an α-rays shielding resin layer is formed by coating at least an active portion of the semiconductor element with a polyimide resin layer which does not undergo thermal decomposition at the time of sealing the semiconductor element, for example, by a ceramic package at a high temperature, is good in adhesion to the semiconductor element, and does not crack.

Another object of this invention is to provide a ceramic packaged or resin molded semiconductor device which is more excellent in α-rays shielding ability than conventional ones.

This invention provides a semiconductor device comprising a semiconductor element at least an active portion of which is coated with an α-rays shielding resin layer, and a package encapsulating said semiconductor element, characterized in that the resin for α-rays shielding resin layer is at least one member selected from the group consisting of a polyimide resin having the repeating unit of the formula:

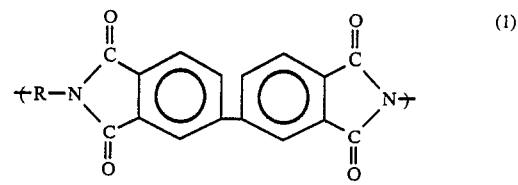

and a polyimide resin having the repeating unit of the formulae:

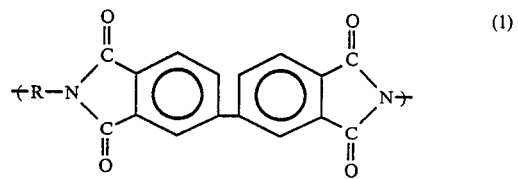

and

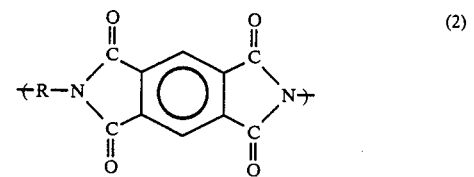

wherein R is

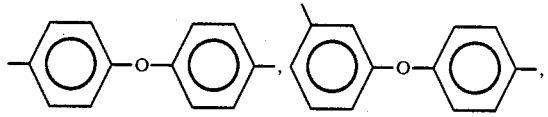

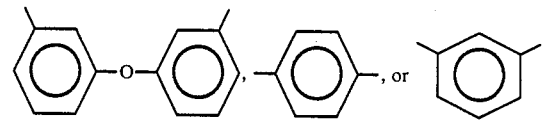

DESCRIPTION OF PREFERRED EMBODIMENTS

Figure 1:
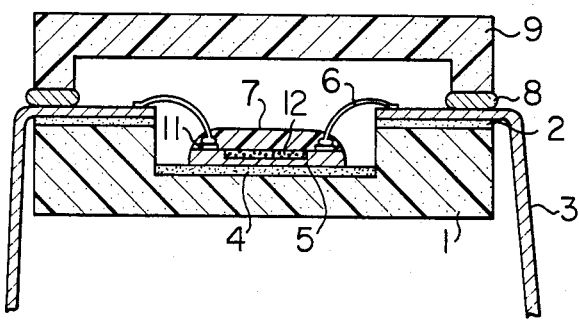
FIG. 1 is a cross-sectional view of a ceramic packaged semiconductor device which is one embodiment of this invention.

The α-rays shielding resin layer covering at least the active portion of the semiconductor element has a thickness of preferably 28 μm or more, preferably 30 μm or more, and a thickness of 30 to 70 μm can particularly preferably be employed. When the thickness is smaller than 28 μm, the shielding ability is insufficient. When the thickness is too large for example, larger than 7μm, the α-rays shielding ability is sufficient but in the case of producing a ceramic packaged semiconductor device, the amount of gas produced by thermal decomposition is increased. Therefore, it is not desirable.

As a resin for forming the α-rays shielding layer, there can be used a polyimide resin having a repeating unit of the formula:

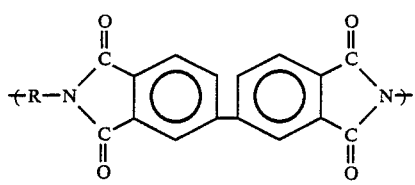
(1)

and/or a polyimide resin having repeating units of the formula:

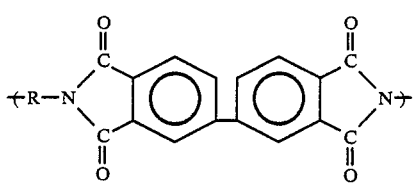
(1)

and

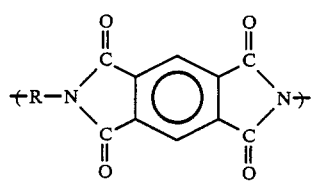
(2)

wherein R is

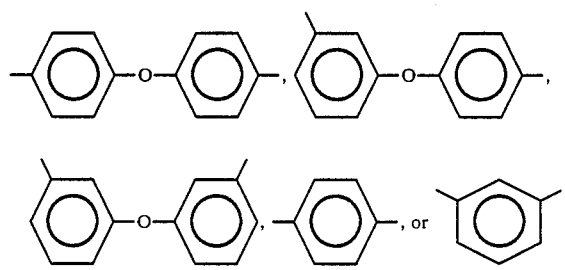

The polyimide resin having a repeating unit of the formula (1) can be obtained from about equivalent molar amounts of a diamine and an acid dianhydride. Concrete examples thereof include polymers obtained by reacting 4,4'-diaminodiphenyl ether with 3,3',4,4'-biphenyltetracarboxylic acid dianhydride; 3,4'-diaminodiphenyl ether with 3,3',4,4'-biphenyltetracarboxylic acid dianhydride; 3,3'-diaminodiphenyl ether with 3,3'4,4'-biphenyltetracarboxylic acid dianhydride; p-phenylenediamine with 3,3',4,4'-biphenyltetracarboxylic acid dianhydride; m-phenylenediamine with 3,3',4,4'-biphenyltetracarboxylic acid dianhydride; 3,3'-diaminodiphenyl ether and p-phenylenediamine with 3,3',4,4'-biphenyltetracarboxylic acid dianhydride; 3,4'-diaminodiphenyl ether and p-phenylenediamine with 3,3',4,4'-biphenyltetracarboxylic acid dianhydride; 4,4'-diaminodiphenyl ether and p-phenylenediamine with 3,3',4,4'-biphenyltetracarboxylic acid dianhydride; or 4,4'-diaminodiphenyl ether and m-phenylenediamine with 3,3',4,4'-biphenyltetracarboxylic acid dianhydride. These polyimide resins can be used alone or as a mixture thereof.

Among the polyimide resins described above, particularly preferable are the polymer obtained by reacting 4,4'-diaminodiphenyl ether with 3,3',4,4'-biphenyltetracarboxylic acid dianhydride and a polymer obtained by reacting 4,4'-diaminodiphenyl ether (100 to 25% by mole) and p-phenylenediamine (0 to 75% by mole) with 3,3',4,4'-biphenyltetracarboxylic acid dianhydride. These can be used alone or as a mixture thereof.

The polyimide resin having repeating units of the formulae (1) and (2) can be produced by further adding pyromellitic acid dianhydride to a combination of monomers for producing the polyimide resin having a repeating unit of the formula (1), preferably adding thereto pyromellitic acid dianhydride in an amount of 50% by mole or less.

Preferable combinations of monomers are 4,4'-diaminodiphenyl ether and 3,3',4,4'-biphenyltetracarboxylic acid dianhydride in about equivalent molar amounts together with pyromellitic acid dianhydride (more preferably in an amount of 50% by mole or less); 4,4'-diaminodiphenyl ether (preferably 100-25% by mole) and p-phenylenediamine (preferably 0-75% by mole) and 3,3',4,4'-biphenyltetracarboxylic acid dianhydride (diamine component: acid component being about 1:1 molar ratio) together with pyromellitic acid dianhydride (more preferably in an amount of 30% by mole or less). The resulting copolymers can be used alone or as a mixture thereof.

Further, the polyimide resin having the repeating unit of the formula (1) and the polyimide resin having the repeating units of the formulae (1) and (2) can be used together.

The polyimide resin used in this invention is hardly or difficultly decomposed at a temperature of 400°–470° C. which temperature is usually used for ceramic packaging. For example, the amount of gas produced by thermal decomposition of the resin at 450° C. is as small as about ½ to ⅓ of that produced in the case of using a conventional polyimide-isoindoloquinazolinedione.

The α-rays shielding resin layer is formed at least on the active portion of the semiconductor element. The term "active portion" means, for example, the portion 12 coated with the polyimide resin layers 7 in FIGS. 1 and 2.

The semiconductor device of this invention is explained below in detail referring to FIGS. 1 and 2.

As a ceramic material used in the ceramic substrate 1 and the ceramic package 9 shown in FIG. 1, there may be used those usually used, for example, aluminous ceramics.

It is sufficient that bonding of the semiconductor element (e.g., IC) 5 to the ceramic substrate is conducted by heating a conventional bonding material, for example, borosilicate glass, concretely LS-2001 manufactured by Nippon Electric Glass Co., Ltd., at 430° C. for 10 minutes to fuse the same. (Numeral 4 shows a bonding agent layer.)

It is sufficient that for bonding of the lead 3 to the ceramic substrate 1, there is used borosilicate glass, concretely LS-0113 manufactured by Nippon Electric Glass Co., Ltd., which is heated at 450° C. for 10 minutes to be fused. (Numeral 2 shows a bonding agent layer.)

It is sufficient that for bonding between the ceramic substrate 1 and the ceramic package 9, borosilicate glass containing alumina or zirconia is used, concretely LS-2001, LS-0113 manufactured by Nippon Electric Glass Co., Ltd., is heated at 450° C. for 10 minutes to be fused. (Numeral 8 shows a bonding agent layer.)

An electrode 11 on the IC 5 and the lead 3 are connected by a bonding wire 6.

Figure 2:
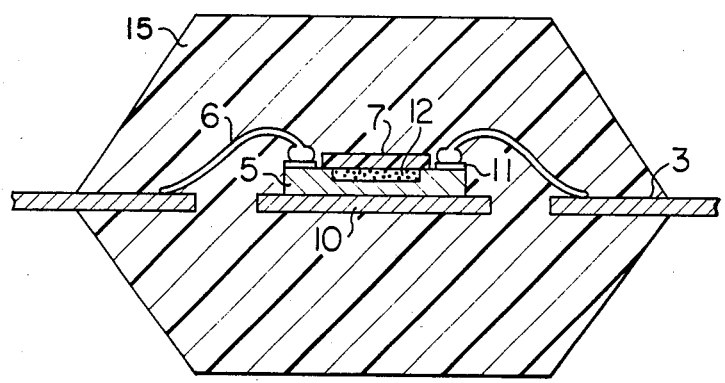
FIG. 2 is a cross-sectional view of a resin molded semiconductor device which is one embodiment of this invention.

On the other hand, it is sufficient that resin molding of the semiconductor device shown in FIG. 2 is conducted by using, for example, a silica-containing epoxy resin. Concretely, there may be exemplified Hysol MH19F-0083 manufactured by the Dexter Corp. It is sufficient that the molding is conducted by injection molding under conditions of a pressure of 50–70 kg/cm$^2$, preferably 70 kg/cm$^2$, a transfer time of 15–20 seconds, preferably 18 seconds, a mold temperature of 170°–185° C., preferably 180° C., and a cure time of 60–180 seconds, preferably 120 seconds.

It is sufficient that bonding between the island 10 of the lead frame and the semiconductor element (e.g., IC) 5 is conducted, for example, by heating an epoxy bonding agent containing 80% by weight of silver powder (EN-4050 manufactured by Hitachi Chemical Company, Ltd.) at 250° C. for 20 seconds.

The α-rays shielding resin layer is obtained by dropping a polyimide varnish onto the surface of the active portion of the semiconductor element, heating the same, for example, at 100°–250° C., preferably 200° C. for 30–60 minutes, preferably 40 minutes, and then heating the same at 260°–450° C., preferably 350° C. for 30–120 minutes, preferably 60 minutes to cure the same. Alternatively, said resin layer may be obtained by applying a polyimide varnish by a spin coating method using a spinner, repeating several times heating of the varnish at 80°–200° C., preferably 150° C. for 30–90 minutes, preferably 30 minutes, and then heating the varnish at 250°–450° C., preferably 350° C. for 30–120 minutes, preferably 60 minutes to cure the same. As another method, it is also possible to form said resin layer by attaching a polyimide film.

As the polyimide varnish used in the above, it is advisable to use, for example, a varnish comprising usually 10 to 30% by weight of a polyimide resin precursor and 90–70% by weight of aprotic polar solvent such as N-methyl-2-pyrrolidone.

As to the attachment of the polyimide film, it is sufficient that the film is bonded by thermally curing by using a bonding agent of the same type.

This invention is explained below in detail referring to Examples.

EXAMPLE 1

As shown in FIG. 1, glass powder having a low melting point (LS-2001 manufactured by Nippon Electric Glass Co., Ltd., softening point 390° C.) was inserted between the hollow of a ceramic substrate 1 having the hollow in the middle and 64-k bit NMOS dynamic RAM, 5 (hereinafter referred to as "IC 5") placed thereon, heated at 430° C. for 10 minutes to be fused, and then cooled to form a bonding agent layer, by which IC 5 was fixed on the ceramic substrate 1.

In the case of a lead 3, glass powder having a low melting point (LS-0113 manufactured by Nippon Electric Glass Co., Ltd., softening point 400° C.) was inserted between the lead 3 and the ceramic substrate 1, heated in a nitrogen gas atmosphere at 450° C. for 10 minutes to be fused, and then cooled to form a bonding agent layer, by which the two described above were bonded to each other.

An electrode 11 on IC 5 and the lead 3 were connected by a bonding wire 6.

Onto IC 5 was dropped a varnish of a polyamide precursor resin (a product of reaction of 4,4'-diaminodiphenyl ether with 3,3',4,4'-biphenyltetracarboxylic acid dianhydride in equimolar amounts) having a repeating unit of the above general formula (1) (the precursor 15% by weight, N-methyl-2-pyrrolidone 85% by weight) to form an uncured varnish coating film, which was heated at 200° C. for 40 minutes and then at 450° C. for 30 minutes to be cured, whereby a polyimide resin layer 7 of 40 μm in thickness was obtained.

Next, a ceramic package 9 was placed on the ceramic substrate, and glass powder having a low melting point (LS-0113 manufactured by Nippon Electric Glass Co., Ltd., softening point 400° C.) was inserted between them, heated at 450° C. for 10 minutes to be fused, and then cooled to bond the two described above to each other by a bonding agent layer 8, whereby a ceramic packaged semiconductor element was obtained.

In the case of the above-mentioned polyimide resin layer, the amount of decomposed gas produced at the time of sealing the ceramic package with glass was ½ or less of that produced in the case of using a conventional polyimide-isoindoloquinazolinedione. Therefore, the glass seal width was as large as 1.0 mm and insufficiency of the air-tightness was not caused.

Further, the frequency of occurrence of soft errors of this device was as very low as 0.001%/1,000 hours or less.

EXAMPLE 2

Ceramic packaged semiconductor elements were obtained in the same manner as in Example 1, except that as a varnish comprising a polyimide precursor, each of nine varnishes of Run Nos. 2 to 10 in Table 1 was used.

All of these elements were free from insufficiency of air-tightness as in Example 1 and showed the same low frequency of occurence of soft errors as in Example 1.

Ceramic packaged semiconductor elements were obtained in the same manner as in Example 1, except that as a varnish comprising a polyimide precursor, No. 11 or No. 12 in Table 1 belonging to conventional varnishes was used. However, in the case of these elements, at least twice as much decomposed gas as that produced in the case of using each of Nos. 2 to 10 in Table 1 was produced at the time of the ceramic packaging, so that insufficiency of air-tightness was caused in some cases. These elements showed a higher frequency of occurence of soft errors than did the elements produced by using each of Nos. 2 to 10 in Table 1.

TABLE 1

| Run No. | Structural formula of resin used | Diamine component* |
|---|---|---|
| 2 | [Structural formula: +(C6H4)-O-(C6H4)-N(CO)2-(C6H3)-(C6H3)-(CO)2N-(C6H4)-(C6H4)-N(CO)2-(C6H3)-(C6H3)-(CO)2N+] | $\frac{4,4'\text{-DDE}}{\text{PPD}} = \frac{9}{1}$ |
| 3 | [Same structural formula as Run 2] | $\frac{4,4'\text{-DDE}}{\text{PPD}} = \frac{4}{1}$ |
| 4 | [Same structural formula] | $\frac{4,4'\text{-DDE}}{\text{PPD}} = \frac{7}{3}$ |
| 5 | [Same structural formula] | $\frac{4,4'\text{-DDE}}{\text{PPD}} = \frac{3}{2}$ |
| 6 | [Same structural formula] | $\frac{4,4'\text{-DDE}}{\text{PPD}} = \frac{1}{1}$ |
| 7 | [Structural formula with BPDA and PMDA units: +(C6H4)-O-(C6H4)-N(CO)2-(C6H3)-(C6H3)-(CO)2N-(C6H4)-O-(C6H4)-N(CO)2-(C6H4)-(CO)2N+] | 4,4'-DDE |
| 8 | [Similar mixed structural formula] | 4,4'-DDE |
| 9 | [Similar mixed structural formula] | 4,4'-DDE |
| 10 | [Similar mixed structural formula] | 4,4'-DDE |
| 11 | +(C6H4)-O-(C6H4)-N(CO)2-(C6H4)-(CO)2N+ | 4,4'-DDE |
| 12 | Polyimide-isoindoloquinazolinedione | 4,4'-DDE |

| Run No. | Acid dianhydride component** | Repeating unit | Reduced viscosity*** ($\eta sp/c$) | Varnish viscosity (poise) | Heat resistance of polymer (°C.) | Adhesion of element | Air-tightness of ceramic package | α-Rays shielding effect**** |
|---|---|---|---|---|---|---|---|---|
| 2 | BPDA | General formula (1) | 1.5 | 128 | 531 | No peeling-off | Good | Good |
| 3 | BPDA | General formula (1) | 1.3 | 131 | 535 | No peeling-off | Good | Good |
| 4 | BPDA | General formula (1) | 1.6 | 129 | 539 | No peeling-off | Good | Good |
| 5 | BPDA | General formula (1) | 1.2 | 130 | 540 | No peeling-off | Good | Good |
| 6 | BPDA | General formula (1) | 1.4 | 132 | 542 | No peeling-off | Good | Good |
| 7 | $\frac{\text{BPDA}}{\text{PMDA}} = \frac{9}{1}$ | General formulae (1) and (2) | 1.1 | 129 | 528 | No peeling-off | Good | Good |
| 8 | $\frac{\text{BPDA}}{\text{PMDA}} = \frac{4}{1}$ | General formulae (1) and (2) | 1.3 | 133 | 530 | No peeling-off | Good | Good |
| 9 | $\frac{\text{BPDA}}{\text{PMDA}} = \frac{7}{3}$ | General formulae (1) and (2) | 0.9 | 135 | 532 | No peeling-off | Good | Good |
| 10 | $\frac{\text{BPDA}}{\text{PMDA}} = \frac{3}{2}$ | General formulae (1) and (2) | 1.0 | 134 | 533 | No peeling-off | Good | Good |
| 11 | PMDA | — | 0.8 | 130 | 480 | No peeling-off | Slightly poor | Slightly poor |
| 12 | — | — | 0.7 | 130 | 480 | No peeling-off | Slightly poor | Slightly poor |

Note of Table 1:
The polymer solid content in the polyimide resin precursor solution used in each Run No. was 15% by weight, and as to impurities contained in the resins, the respective contents of Na, K, Fe and Ca ions were less than 0.1 ppm and the respective contents of U and Th were less than 0.5 ppb.
*4,4'-DDE = 4,4'-diaminodiphenyl ether  PPD = p-phenylenediamine
**PMDA = pyromellitic acid dianhydride  BPDA = 3,3',4,4'-biphenyltetracarboxylic acid dianhydride
***Measuring conditions: solvent: N—methyl-2-pyrrolidone  concentration: 0.1 dl/100 ml  temperature: 30° C.
****Thickness: 35 μm

EXAMPLE 3

As shown in FIG. 2, an epoxy binding agent containing silver powder (EN-4050, a trade name manufactured by Hitachi Chemical Company, Ltd.) was inserted between a 64-Kbit NMOS dynamic RAM, 5(IC, 5) and the island 10 of a lead frame, and heated at 250° C. for 20 seconds to be cured to bond them to each other.

An electrode 11 for taking out external wiring of IC 5 and the lead frame 3 were connected by a bonding wire 6 made of gold.

Each of the varnishes comprising each of six kinds, in all, of polyimide resins of Run Nos. 13 to 18 in Table 2 (the precursor 15% by weight, N-methyl-2-pyrrolidone 85% by weight) was applied onto the whole surface of IC 5 by a spin coating method using a spinner, and heating of the varnish at 150° C. for 30 minutes was repeated twice to obtain a semicured polyimide resin film (not shown).

A negative type photoresist (ONNR-20 manufactured by Tokyo Ohka Kogyo Co., Ltd.) was screen-printed on the resin film, which was exposed to light (as 5 mW for 60 seconds), developed (with developing solution I for ONNR manufactured by Tokyo Ohka Kogyo Co., Ltd., at 25° C. for 2 minutes, and then with a developing solution for ONNR at 25° C. for 2 minutes), rinsed (with a rinsing solution manufactured by Tokyo Ohka Kogyo Co., Ltd., for 2 minutes) and then post-baked at 100° C. The bonding portion was removed by etching by using an etching solution at 40° C. comprising 7 volumes of hydrazine hydrate and 3 volumes of ethylenediamine, and the resin film was washed with water, after which the resist was removed (with S-502 manufactured by Tokyo Ohka Kogyo Co., Ltd. at 110° C. for 10 minutes), and the resin film was washed (with trichloroethylene for 5 minutes, and then with isopropanol for 5 minutes) and dried.

Thereafter, the semicured polyimide resin film was heated at 350° C. for 60 minutes to be completely cured, whereby a polyimide resin layer 7 of 35 μm in thickness was obtained.

Subsequently, a silica-containing epoxy molding material (Hysol MH19F-0083 manufactured by The Dexter Corp.) was transfer-molded (pressure 70 kg/cm², transfer time 18 sec, mold temperature 180° C., cure time 120 sec.) to form a resin packaged body 15, whereby a resin molded semiconductor device was obtained.

The soft error rate of the thus obtained resin molded semiconductor device was low as in Example 1.

TABLE 2

| Run No. | Structural formula of resin used | Diamine component* |
|---|---|---|
| 13 | [chemical structure: phenyl-O-phenyl-N(CO)₂-biphenyl-(CO)₂N—]ₙ | 3,4'-DDE |
| 14 | [chemical structure: phenyl-O-phenyl-N(CO)₂-biphenyl-(CO)₂N-phenyl-N(CO)₂-biphenyl-(CO)₂N—]ₙ | $\frac{3,4'\text{-DDE}}{\text{PPD}} = \frac{3}{7}$ |
| 15 | [chemical structure: phenyl-N(CO)₂-biphenyl-(CO)₂N—]ₙ | PPD |
| 16 | [chemical structure: phenyl-O-phenyl-N(CO)₂-biphenyl-(CO)₂N-phenyl-N(CO)₂-biphenyl-(CO)₂N—]ₙ | $\frac{3,3'\text{-DDE}}{\text{PPD}} = \frac{3}{7}$ |
| 17 | [chemical structure: phenyl-N(CO)₂-biphenyl-(CO)₂N—]ₙ | MPD |
| 18 | [chemical structure: phenyl-N(CO)₂-biphenyl-(CO)₂N-phenyl-N(CO)₂-biphenyl-(CO)₂N—]ₙ | $\frac{\text{MPD}}{\text{PPD}} = \frac{1}{1}$ |

| Run No. | Acid dianhydride component** | Repeating unit | Reduced viscosity*** ηsp/c | Adhesion to element | α-Rays shielding effect**** |
|---|---|---|---|---|---|
| 13 | BPDA | General formula (1) | 1.4 | No peeling-off | Good |
| 14 | BPDA | General formula (1) | 1.5 | No peeling-off | Good |
| 15 | BPDA | General formula (1) | 1.2 | No peeling-off | Good |
| 16 | BPDA | General formula (1) | 1.3 | No peeling-off | Good |
| 17 | BPDA | General formula (1) | 1.4 | No peeling-off | Good |

TABLE 2-continued

| 18 | BPDA | General formula (1) | 1.2 | No peeling-off | Good |

Note of Table 2:
The polymer solid content in the polyimide resin precursor solution used in each Run No. was 15% by weight; the viscosity of each varnish was 80 to 130 poises; and as to impurities contained in the resins, the respective contents of Na, K, Fe and Ca ions were less than 0.1 ppm and the respective contents of U and Th were less than 0.05 ppb.
*3,4'-DDE = 3,4'-diaminodiphenyl ether PPD = p-phenylenediamine 3,3'-DDE = 3,3'-diaminodiphenyl ether MPD = m-phenylenediamine
**BPDA = 3,3',4,4'-biphenyltetracarboxylic acid dianhydride
***Measuring conditions: solvent: N—methyl-2-pyrrolidone concentration: 0.1 dl/100 ml Temperature: 30° C.
****Thickness: 35 μm

EXAMPLE 4

Figure 3:
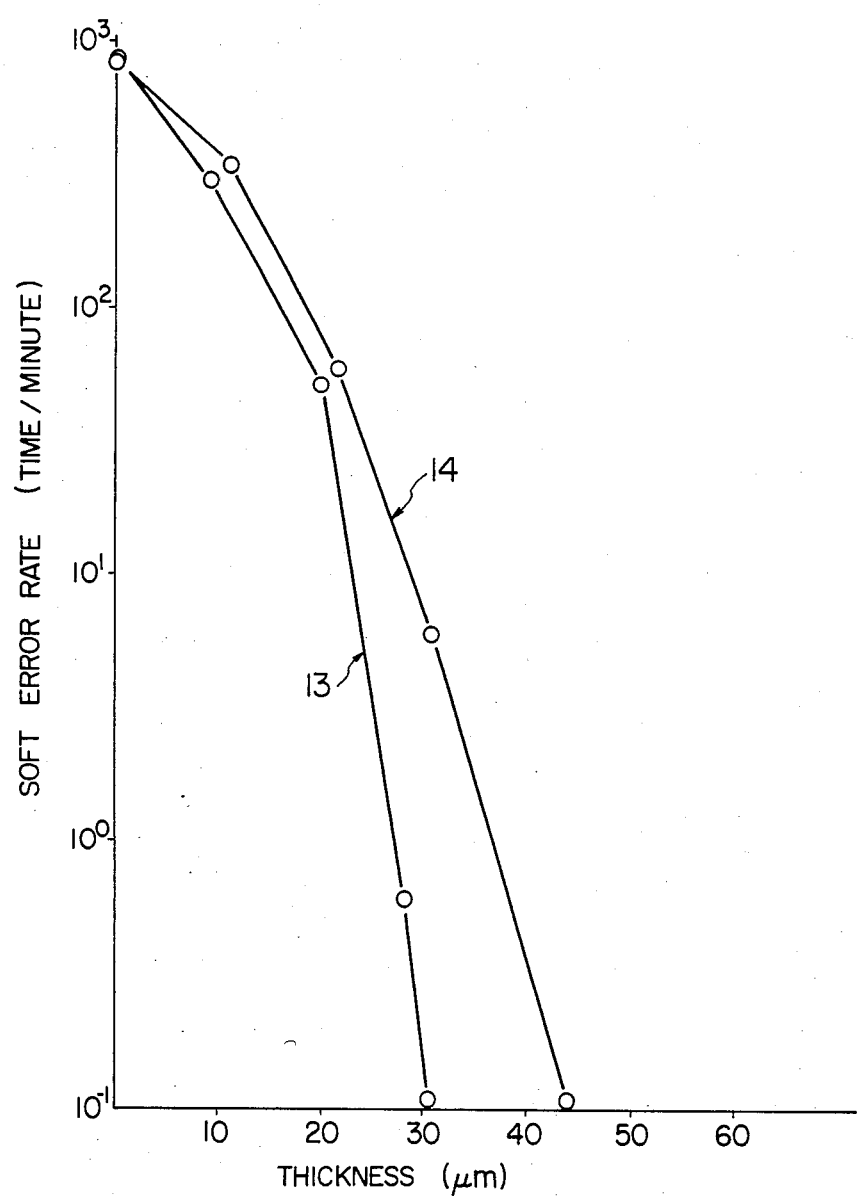
FIG. 3 is a graph showing changes, with the thickness of a resin coating, of the numbers of occurence of soft errors due to α-rays of the ceramic packaged semiconductor device and the resin molded semiconductor device of this invention compared with those of conventional ceramic packaged and resin molded semiconductor devices.

A polyimide resin layer of 9, 20, 28 or 31 μm in thickness was formed on the active portion of a semiconductor element in the same manner as in Example 1 by using the polymer of Example 1 as a polyimide resin precursor, and ceramic packaged semiconductor devices were produced in the same manner as in Example 1. The soft error rate of each device was low as shown in curve 13 of FIG. 3. Moreover, insufficiency of airtightness was not cured.

On the other hand, a polyimide resin layer of 11, 21, 31 or 44 μm in thickness was formed on the active portion of a semiconductor element in the same manner as in Example 1, except that Run No. 12 in Table 1, which was a conventional material, was used as a polyamide resin precursor, and ceramic packaged semiconductor devices were produced in the same manner as in Example 1. The soft error rate of each device was high as shown in curve 14 of FIG. 3. Furthermore, insufficiency of airtightness was caused.

What is claimed is:

1. In a semiconductor device comprising a semiconductor element at least an active portion of which is coated with an α-rays shielding resin layer, and a package encapsulating said semiconductor element, the improvement wherein the resin for the α-ray shielding resin layer is a polyimide resin formed by dropping or spin coating a varnish of a precursor of the polyimide resin containing an aprotic polar solvent on the active portion and heating the varnish, the resin being at least one member selected from the group consisting of a polyimide resin having the repeating unit of the formula:

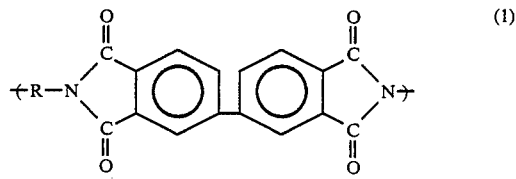

(1)

and a polyimide resin having the repeating unit of the formulae:

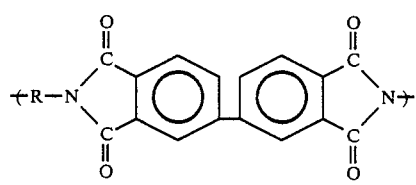

(1)

and

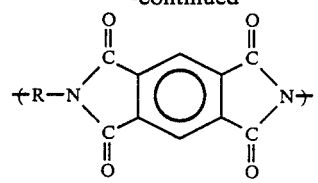

(2)

wherein R is

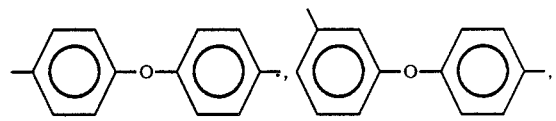

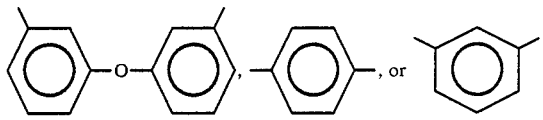

2. A semiconductor device according to claim 1, wherein the package is a ceramic package.

3. A semiconductor device according to claim 2, wherein the thickness of the α-rays shielding resin layer is 28 to 70 μm.

4. A semiconductor device according to claim 2, wherein the polyimide resin having the repeating unit of the formula (1) is obtained from 4,4'-diaminodiphenyl ether and 3,3',4,4'-biphenyltetracarboxylic acid dianhydride, or 4,4'-diaminodiphenyl ether and p-phenylenediamine (the former 100 to 25% by mole and the latter 0 to 75% by mole) and 3,3',4,4'-biphenyltetracarboxylic acid dianhydride.

5. A semiconductor device according to claim 2, wherein the polyimide resin having the repeating unit of the formulae (1) and (2) is obtained from (a) 4,4'-diaminodiphenyl ether, 3,3',4,4'-biphenyltetracarboxylic acid dianhydride and pyromellitic acid dianhydride, or (b) 4,4'-diaminodiphenyl ether, p-phenylenediamine (the former 100 to 25% by mole and the latter 0 to 75% by mole), 3,3',4,4'-biphenyltetracarboxylic acid dianhydride and pyromellitic acid dianhydride.

6. A semiconductor device according to claim 1, wherein the package is a resin package.

7. A semiconductor device according to claim 6, wherein the thickness of the α-rays shielding resin layer is 28 to 70 μm.

8. A semiconductor device according to claim 6, wherein the polyimide resin having the repeating unit of the formula (1) is obtained from 4,4'-diaminodiphenyl ether and 3,3',4,4'-biphenyltetracarboxylic acid dianhydride, or 4,4'-diaminodiphenyl ether and p-phenylenediamine (the former 100 to 25% by mole and the latter 0 to 75% by mole) and 3,3',4,4'-biphenyltetracarboxylic acid dianhydride.

9. A semiconductor device according to claim 6, wherein the polyimide resin having the repeating unit of the formulae (1) and (2) is obtained from (a) 4,4'-diaminodiphenyl ether, 3,3',4,4'-biphenyltetracarboxylic acid dianhydride and pyromellitic acid dianhydride, or (b) 4,4'-diaminodiphenyl ether, p-phenylenediamine (the former 100 to 25% by mole and the latter 0 to 75% by mole), 3,3',4,4'-biphenyltetracarboxylic acid dianhydride and pyromellitic acid dianhydride.

10. A semiconductor device according to claim 1, wherein said α-rays shielding resin layer is directly coated on said active portion.

11. A semiconductor device according to claim 1, wherein the thickness of the α-rays shielding resin layer is 28 to 70 μm.

12. A semiconductor device according to claim 1, wherein the varnish comprises 10 to 30% by weight of the polyimide resin precursor and 90 to 70% by weight of the aprotic polar solvent.

* * * * *